United States Patent

Doriath et al.

[11] Patent Number: 4,731,581
[45] Date of Patent: Mar. 15, 1988

[54] MEASUREMENT HEAD FOR A MAGNETIC FIELD GRADIENT VECTOR MEASURING APPARATUS, AN APPARATUS COMPRISING SUCH A HEAD AND A MEASUREMENT PROCESS

[75] Inventors: Gérard Doriath, Palaiseau; Pierre Hartemann, Paris; Joël Martin, Boussy St. Antoine, all of France

[73] Assignee: Thomson-CSF, Paris, France

[21] Appl. No.: 73,331

[22] Filed: Jul. 13, 1987

Related U.S. Application Data

[63] Continuation of Ser. No. 627,098, Jul. 2, 1984, abandoned.

[30] Foreign Application Priority Data

Jul. 4, 1983 [FR] France ............... 83 11073

[51] Int. Cl.[4] ............... G01R 33/022; G01R 33/032; G02F 1/09
[52] U.S. Cl. ............... 324/244; 324/260; 350/376
[58] Field of Search ............... 324/96, 244, 260; 350/375, 376; 250/231 R; 356/368

[56] References Cited

U.S. PATENT DOCUMENTS

| | | | |
|---|---|---|---|
| 2,975,360 | 3/1961 | Bell | 324/244 |
| 3,703,682 | 11/1972 | Wickman et al. | |
| 4,112,367 | 9/1978 | Hepner et al. | 324/244 |
| 4,327,327 | 4/1982 | Greenwood et al. | 324/304 |
| 4,449,096 | 5/1984 | Doriath et al. | 324/244 |
| 4,516,073 | 5/1985 | Doriath et al. | 324/244 |
| 4,563,646 | 1/1986 | Desormiere | 324/244 |
| 4,587,487 | 5/1986 | Zanzucchi | 324/244 |
| 4,621,192 | 11/1986 | Duthoit et al. | 324/244 X |
| 4,665,363 | 5/1987 | Extance et al. | 324/244 |
| 4,675,522 | 6/1987 | Arunkumar | 324/244 X |

FOREIGN PATENT DOCUMENTS

0030876 6/1981 European Pat. Off.

*Primary Examiner*—Gerard R. Strecker
*Attorney, Agent, or Firm*—Oblon, Fisher, Spivak, McClelland & Maier

[57] ABSTRACT

A measurement head for a magnetic field gradient vector measuring apparatus, comprising essentially a laser diode emitting two light beams aligned along the same axis. Two magnetic field measuring cells are placed in the paths of these light beams. Each cell comprises a wafer coated with a layer of a magnetic material forming a waveguide. The purpose of each cell is to measure the Faraday effect on the polarization of the magnetic field by using a zero method. A difference circuit then calculates the difference between the commands given to each cell so as to find the value of the magnetic field gradient.

22 Claims, 6 Drawing Figures

MEASUREMENT HEAD FOR A MAGNETIC FIELD GRADIENT VECTOR MEASURING APPARATUS, AN APPARATUS COMPRISING SUCH A HEAD AND A MEASUREMENT PROCESS

This application is a continuation Ser. No. 06/627,098, filed on Jul. 2, 1984, now abandoned.

BACKGROUND OF THE INVENTION

The present invention relates to devices for measuring the gradient vector of a magnetic field. It relates more particularly to a measurement head for measuring the magnetic field gradient vector between two points in space as well as a magnetic gradient field vector measurement apparatus using such a head.

The value of a magnetic field can be accurately measured at a given point. This requirement of accuracy leads to designing apparatus whose sensitivity is such that their measurement may be affected by fluctuations of the ambient magnetic field. Thus, for example, small magnetic fields of the order of a nano Tesla can be measured with some magnetometers, whereas it is usual for the ambient magnetic field to present amplitudes with variations reaching a few tens to a few hundred nano Teslas in a frequency spectrum extending from the continuous to a few tens of Hertz.

To obtain accurate magnetic field measurements and to be able to correct them depending on the variations of the ambient magnetic field; it is possible to make different measurements at several points in the measurement zone with a non directional magnetometer. Thus a map of the magnetic field is established. This method has the drawback of being time-consuming.

Directional magnetometers may also be used, such as the magnetometers described in French patent application No. 79 30721 as well as in the first addition to this patent published under the No. 2 517 831. In this case, two magnetometers could effect the gradient measurement providing that their measurement axes are perfectly aligned. But such alignment raises problems. These problems are all the more difficult to solve the smaller the fields to be measured.

Thus, with the invention, these problems concerning the alignment of the measurement axes of these measurement devices may be solved.

BRIEF SUMMARY OF THE INVENTION

The invention provides then a measurement head for a magnetic field gradient vector measuring apparatus, comprising an emission device emitting a linearly polarized light beam; a first and a second cell made from a magnetic material, each cell comprising an input face and an output face aligned along the axis of the light beam and providing, therewithin, guided propagation of the beam as well as rotation of the polarization direction of the beam during its propagation; polarization rotation measurement means associated with each cell along the axis of the light beam, receiving the beam after it has passed through the associated cell and measuring the polarization rotation of the beam; difference computing means receiving signals representing the measurement results of the measurement means and delivering in exchange information representative of the difference between the two measurements.

The invention also relates to a magnetic field gradient measurement process as well as an apparatus using the measurement head of the invention and the measurement process.

BRIEF DESCRIPTION OF THE DRAWINGS

The invention will be better understood and other features will be clear from the following description, with reference to the accompanying figures in which.

DETAILED DESCRIPTION OF THE PREFERRED EMBODIMENTS

Figure 1:
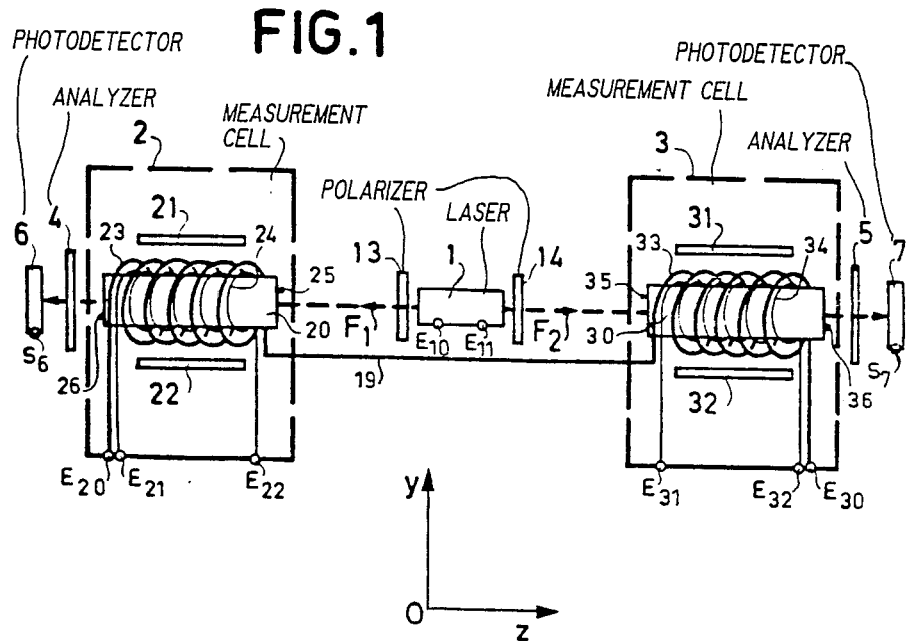
FIG. 1 shows schematically a measurement head in accordance with the invention in which a laser is placed between two measurement cells.

The measurement head of FIG. 1 comprises a semiconductor laser source or laser diode 1, two polarizers 13 and 14, two measurement cells 2 and 3, two analyzers 4 and 5 and two photodetector diodes 6 and 7 situated in a plane yOz.

The laser diode 1 emits, from two of its opposite faces two collimated light beams F1 and F2 whose axes are strictly in the extension one of the other. The emissive surface of each face has typically dimensions of 0.2 micron by 15 microns. Such a diode is supplied with a given electric voltage applied to its input connections E10 and E11.

The measurement cell 2 comprises a wafer 20 cut from a gadolinium and gallium garnate, called GGG, whose dimensions length by width by thickness are about $5 \times 3 \times 0.7$ mm. On the GGG surface a relatively thick layer of YIG is grown by epitaxy corresponding substantially to the composition $Gd_{0.45}Y_{2.55}Ga_{0.9}Fe_{4.1}O_{12}$. The thickness obtained may be between 5 and 110 microns and a typical value is 20 microns.

With such a thickness of YIG, the light may be caused to propagate in a guided but multimode manner and therefore the Faraday effect due to the magnetic field reveals itself solely by rotation of the polarization plane of the light and not by a conversion from TM to TE mode. Thus, the light beam may be coupled through the end faces of the YIG layer. In the following description, the functional role of the YIG layer will be considered in the use of water 20.

The measurement cell 2 also comprises an energization coil 23 and a compensation coil 24, both concentric inside which wafer 20 is placed and two pole pieces 21 and 22 situated on each side of wafer 20 and inducing a continuous magnetic field in wafer 20 along the main plane of the wafer and transversely to the direction of propagation of the light in the wafer.

The measurement cell 3 is formed in identical way to that of measurement cell 2. In particular, coil 33 has the same characteristics as coil 23 to which it is connected in series by the connecting wire 19 so that, fed with the same current, these two coils induce identical magnetic fields in the two wafers 20 and 30. It should be noted that these two coils 23 and 33 could be a single coil accomodating the two wafers 20 and 30.

The two measurement cells 2 and 3 are situated on each side of the laser diode in the paths of beams F1 and F2. Wafer 20 of cell 2 receives beam F1 at its input face 25 and retransmits it through its output face 26 to the analyzer 4 and to the photodetector diode 6. The same goes for wafer 30 of measurement cell 3 in so far as beam F2, analyzer 5 and photodetector diode 7 are concerned.

The operation will now be described of one of the measurement cells, 2 for example, plunged in a magnetic field to be measured.

The laser diode 1 is fed with power at its input terminals E10 and E11 from an appropriate source not shown. It supplies a light beam F1 of a power of a few milliwatts at a wavelength of 1.3 micron. After passing through the polarizer 13, the beam F1 is coupled to wafer 20 through the input face 25. Wafer 20 acts as wave-guide. The magnetic field to be measured induces in plate 20 a Faraday effect which results in rotation of the polarization plane of the light. This rotation is proportional to the intensity of the component of the magnetic field in the direction of propagation of the light, i.e. axis Oz. It is then advantageous to orientate the measurement head assembly shown in FIG. 1 in the magnetic field to be measured so that beam F1 is directed along the lines of this magnetic field.

Moreover, the pole pieces 21 and 22 induce in wafer 20 a magnetic field directed along axis Oy so that, in the absence of a field to be measured, the magnetizing vector is transversal and the effect of a field to be measured along axis Oz is maximum. It should be mentioned that this transverse field provided by pole pieces 21 and 22 saturates the wafers to a value possibly reaching the value of one oersted.

The rotation of the polarization plane due to the field to be measured is detected, after it has been transmitted through face 26 of wafer 20 and has passed through analyzer 4, by the photodetector diode 6. This latter supplies at its output S6 a measurement signal delivered to measurement devices not shown.

The rotation of the polarization field of the light is not a linear function of the magnetic field to be measured along the direction of propagation of beam F1 (axis Oz). It is therefore difficult to express the measurement result obtained at output S6 as a measured magnetic field value. A zero method is therefore used. For that, the energization coil 23 is supplied with an AC current. In the figure, coils 23 and 33 of cells 2 and 3 are supplied with power in series by the inputs connections E20 and E30. Coil 23 induces in wafer 20 an alternating magnetic field parallel to the direction of propagation of beam F1, i.e. along axis Oz, and therefore parallel to the field to be measured. This latter is modulated by the alternating field provided by coil 23. The intensity of the light detected by the photodetector diode 6 is therefore modulated. In the absence of a magnetic field to be measured, the intensity of the light varies according to a law containing only even harmonics of the energization signal applied to coil 23. The presence of a magnetic field to be measured along axis Oz causes uneven harmonics to appear. The amplitude of the fundamental varies as a function of the value of the field to be measured. To carry out the zero method, the compensation coil 24 is fed, through its input terminals E21 and E22, with a DC current by means of power supply circuits not shown. Coil 24 induces in wafer 20 a continuous magnetic field in the direction of beam F1, i.e. in the direction of the field to be measured. By appropriate adjustment of the value of the DC current in direction and amplitude so that the continuous field induced counterbalances the field to be measured, this latter no longer has any effect on the rotation of the polarization plane of beam F1. It is then sufficient to measure the value of the DC current supplied to coil 24 in order to derive therefrom the value of the measured field.

The measurement cell 2 has then allowed a magnetic field to be measured. Measurement cell 3 functions in the same way and also allows a magnetic field to be measured. The difference between the DC currents applied to the input terminals E21, E22 of the compensation coil 24 and to the input terminals E31, E32 of the compensation coil 34 gives the difference between the amplitudes of the magnetic fields measured at the positions of measurement cells 2 and 3. Moreover, since these cells are orientated along the same axis and in the direction of the field to be measured, the difference between the DC currents measured represents the value of the vector of the magnetic field gradient.

By placing measurement cells 2 and 3 in the paths of the light beams emitted by the laser diode 1 and by using the unidirectional property of the light beams emitted for accurately aligning the measurement cells 2 and 3, the value of a magnetic field gradient vector may be measured with the measurement head of the invention.

Figure 2:
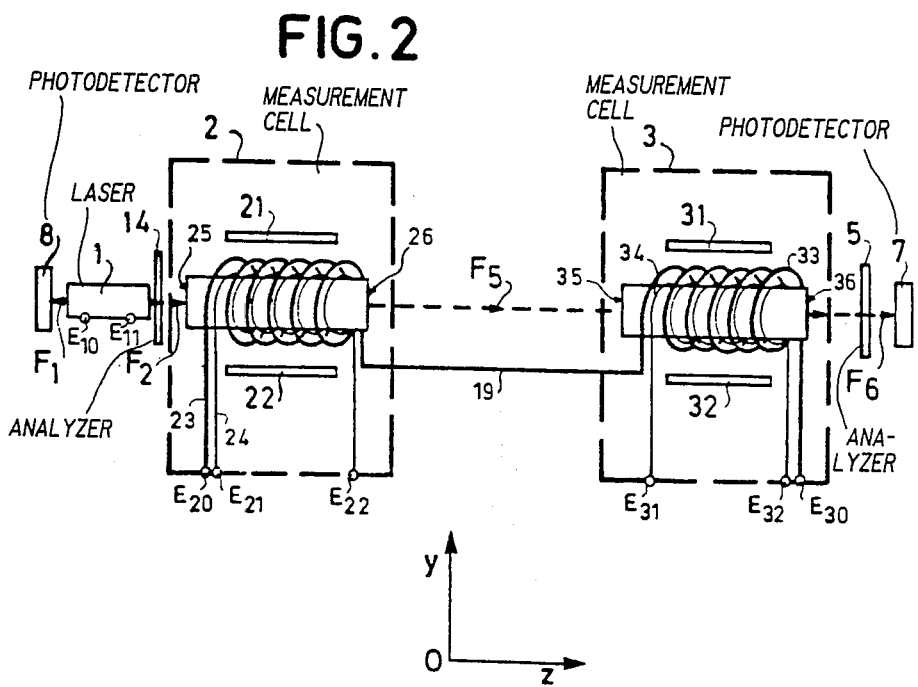
FIG. 2 shows schematically a measurement head in accordance with the invention in which a laser is placed on the same side with respect to two measurement cells.

FIG. 2 shows a measurement head in which the laser diode 1 is placed on the same side with respect to measurement cells 2 and 3. These latter are strictly aligned in the direction of a beam emitted by the laser diode 1.

Beam F1 emitted by the laser diode 1 is directed to a photodetector diode 8 which delivers a signal and allows, by known means not shown, the supply power to be adjusted and so the emission power of the laser diode 1.

Beam F2 of the laser diode 1 is transmitted to a polarizer 14 which transmits it to the input face 25 of the wafer 29 of cell 2. This latter retransmits it through the output face 26 in the form of a beam F5 to the input face 35 of wafer 30 of cell 3. Finally, beam F6 exiting through face 36 is transmitted by the analyzer 5 to a photodetector cell 7.

The operation of measurement cells 2 and 3 is identical to that of the measurement cells of FIG. 1. By supplying to inputs E21 and E22 of coil 24 and to the inputs E31 and E32 of coil 34 appropriate DC currents, the effects of the magnetic fields at the positions of the two measurement cells are counterbalanced. From the difference between the DC currents supplied, the value of the magnetic field gradient can be obtained. The difference between this arrangement and that of FIG. 1 resides in the fact that beam F1 and the photodetector diode 8 are used for adjusting the emission power of the laser diode 1.

Figure 3:
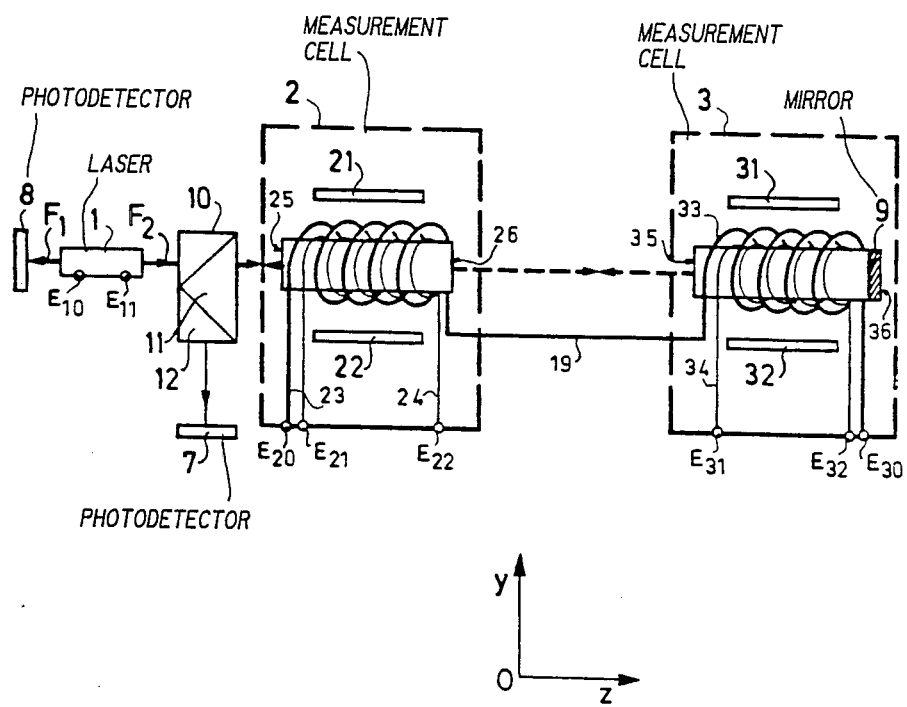
FIG. 3 shows an explanatory diagram of a variant of FIG. 2.

FIG. 3 shows a measurement head in which the light beam travels in both directions through the measurement cells 2 and 3.

Cells 2 and 3 have the same construction as those of FIGS. 1 and 2. With respect to the head of FIG. 1, a system of prisms 10,11,12 has been inserted in the path of the beam F2 between the laser diode 1 and measurement cell 2 for reflecting the light to a photodetector diode 7. In addition a mirror 9 has been coupled to the output face 36 of wafer 30 of cell 3.

In the same way as in the head of FIG. 1, beam F1 and the photodetector diode allow the emission power of the laser diode 1 to be adjusted.

Beam F2, because of its polarization, is transmitted by prisms 10 and 11 to cell 2 which retransmits it to cell 3. The light beam is reflected by mirror 9 and passes again through cell 3 then through cell 2. The prism system 10, 11, 12 reflects the beam supplied by cell 2 and retransmits it to the photodetector diode 7.

The light beam passes then twice through each cell. It is then apparent that the DC currents to be supplied at the inputs E21, E22 of the compensation coil 24 and E31, E32 of compensation coil 34 must be of an amplitude double that required for compensating a single crossing through each cell as in the case of FIG. 2. The difference between the currents supplied is then double that obtained with a circuit of the type shown in FIG. 2. The measurement accuracy of the magnetic field gradient is therefore improved.

Figure 4:
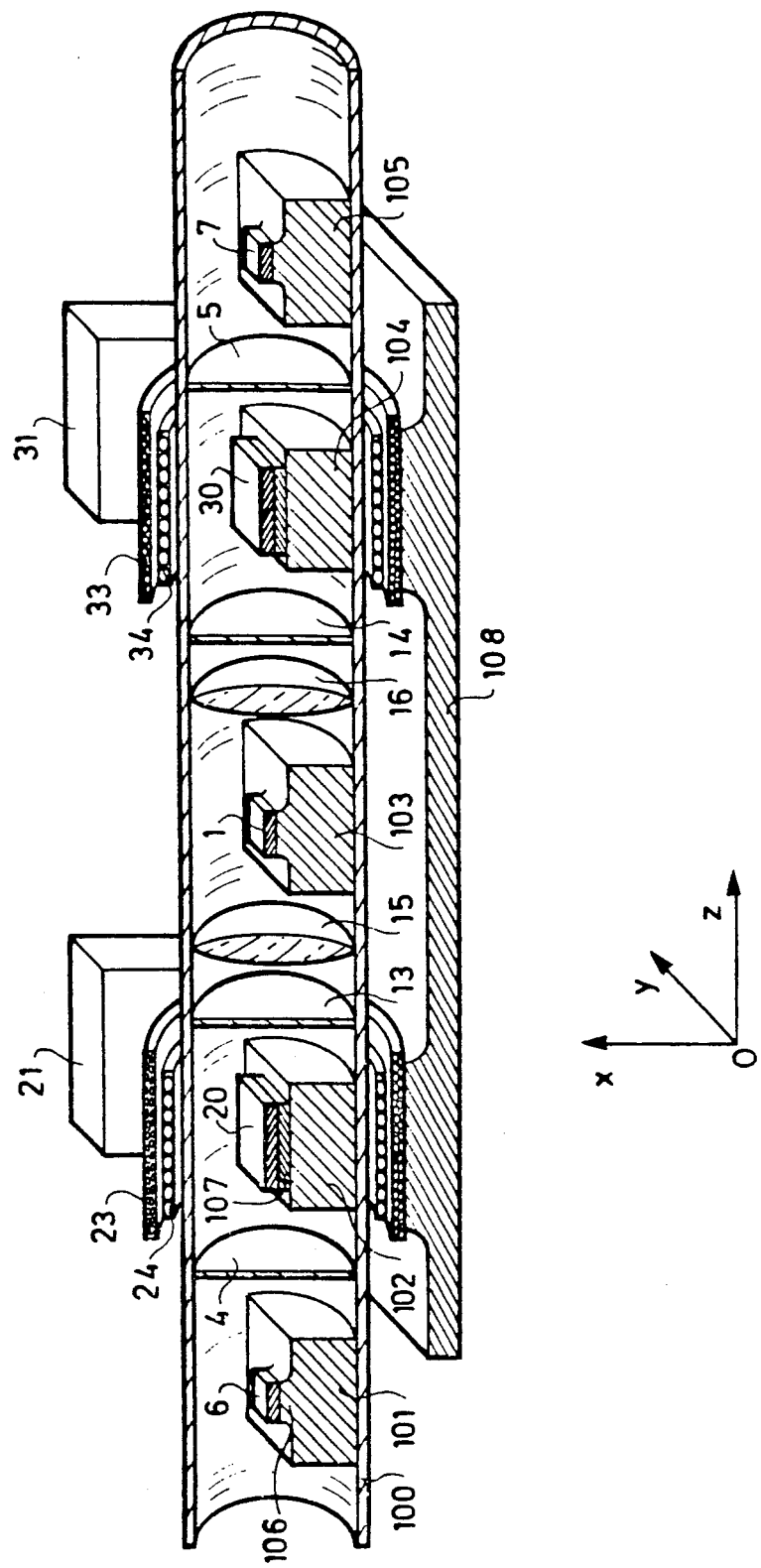
FIG. 4 shows a concrete embodiment of the measurement head of FIG. 1.

Referring to FIG. 4, a concrete embodiment of a measuring head in accordance with the invention will now be described, designed with an orthonormed reference system Oxyz whose axes Oy and Oz correspond to the axes Oy and Oz of FIGS. 1 to 3.

This measurement head corresponds to the explanatory diagram given in FIG. 1. It is obvious that measurement heads conforming to the simplified diagrams of FIGS. 2 and 3 may be constructed in a similar way.

This measurement head comprises a rigid tube 100 inside which are provided fixed bases 101, 102, 103, 104 and 105 whose main faces are parallel. Bases 101, 103 and 105 have a boss, such as 106, whose upper face has been carefully machined. On bases 101 and 105 are mounted photodetector diodes 6 and 7 and on base 103 is mounted the laser diode 1. The height adjustment of these components on the bases is readily adjusted by means of shims not shown. On bases 102 and 104 are mounted the wafers 20 and 30 with, by way of example, shims such as 107 for height adjustment thereof. The axial adjustment and immobilization of all these components on their base is provided in a way known per se by means not shown and, in the optimum position, they are aligned in the direction of the light beams emitted by the laser diode 1. Between the laser diode 1, on the one hand, and wafers 20 and 30 on the other are mounted polarizers 13 and 14 as well as focussing lenses 15 and 16. Between wafers 20 and 30 and the photodetector diodes are mounted analyzers 4 and 5. Polarizers 13 and 14, lenses 15 and 16 and analyzers 4 and 5 are mounted inside tube 100 so that they cause no deflection in the direction of the light beams, this mounting being carried out in a way known per se in the technique for manufacturing optical instruments.

The energization coils 23 and 33 and the compensation coils 24 and 34 are mounted about tube 100 so as to be centered in the longitudinal direction on wafers 20 and 30.

Finally, the assembly is fixed to a support frame 108 on which the pole pieces 21, 31 are mounted (as well as 22 and 32 not shown in FIG. 4), inducing a continuous magnetic field in the plane of wafers 20 and 30 transversely to the direction of the light beams emitted by the laser diode 1.

Figure 5:
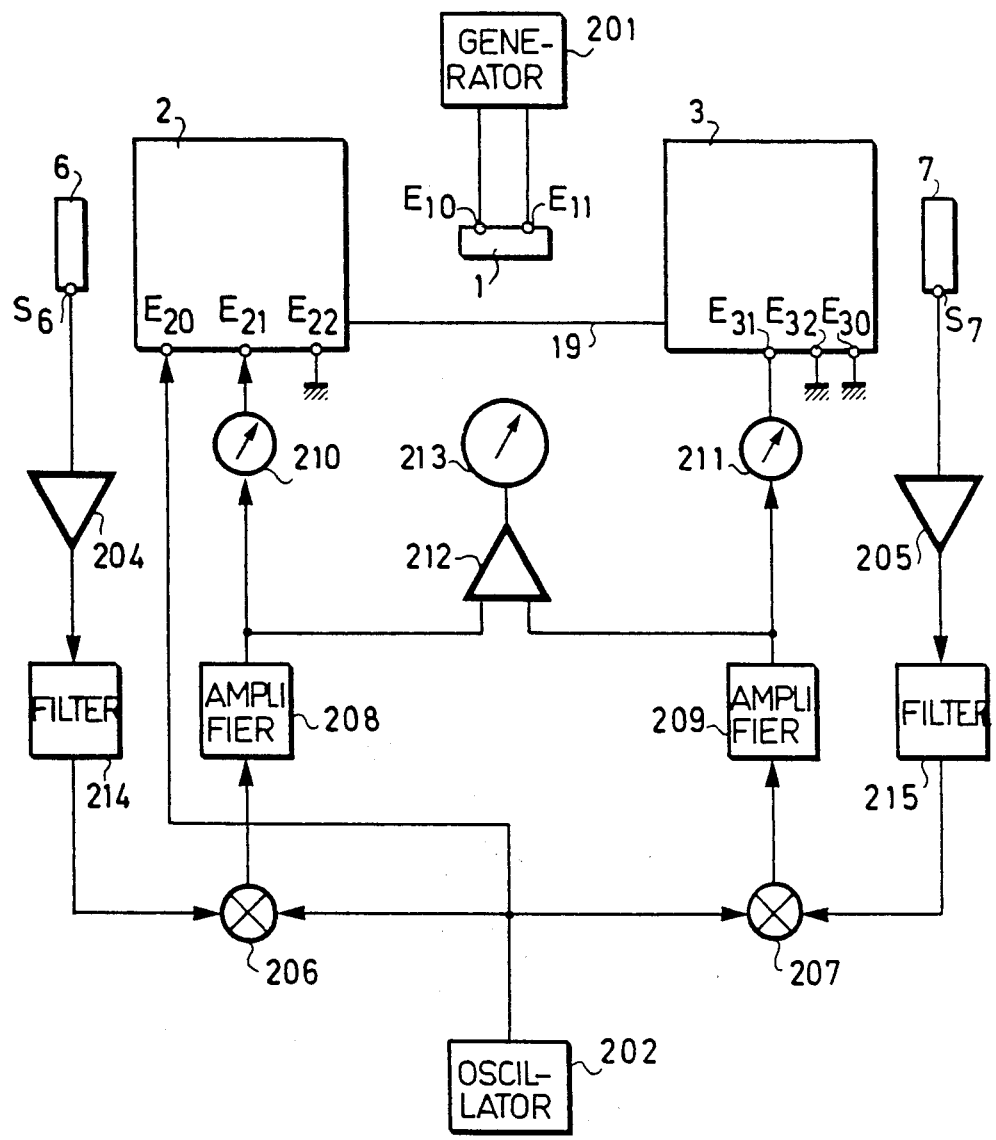
FIG. 5 shows one embodiment of the circuits for controlling the measurement head of FIG. 1 and forming with the measurement head the measuring apparatus of the invention.

FIG. 5 shows one embodiment of the circuits for controlling the measurement head such as described with reference to FIG. 1.

We find again in this figure the laser diode 1 with its input terminals E10 and E11, the measurement cells 2 and 3 with their input terminals E20 to E22 and E30 to E32, the photodetector diodes 6 and 7 with their input terminals S6 and S7. The input terminals E22, E32 and E30 are grounded.

The laser diode is fed with current from a power supply circuit 201 connected to its input terminals E10 and E11. For a laser diode emitting in the infrared and at a wavelength of 1.3 micron, a light power of 4 milliwatts is obtained with a supply current of 200 milliamps. Such a light power is perfectly suitable for causing the device to operate at the desired sensitivity.

An oscillator 202 supplies a signal at a relatively high frequency fo, of 100 KHz for example. This signal is applied to the input terminal E20 of measurement cell 2 and is retransmitted to measurement cell 3 by the connection wire 19. An AC current flows then between the input terminals E20 and E30 in the energization coils 23 and 33 (see FIG. 1). An alternating field is induced in wafers 20 and 30 in the direction of beams F1 and F2.

The photodetector diodes 6 and 7 detect respectively beams F1 and F2 and deliver signals at their output S6 and S7. In the absence of a continuous magnetic field component directed in the direction of propagation of the beams, these signals have a frequency 2 fo double the frequency of the oscillator.

These signals are amplified by amplifiers 204, 205 then filtered by selective filters 214, 215 at the frequency Fo.

The output signal of each filter is compared with the signal supplied by oscillator 202, in a detection circuit (206,207), which measures both the amplitude of each of them at the frequency of the fundamental and the phase change at zero crossover. The detection circuits 206 and 207 do not supply an output signal.

IN the presence of a continuous magnetic field component directed in the direction of propagation of the light beams, the signals detected by the photodetector diodes 6 and 7 are deformed with respect to the preceding signals. The output signal of each filter 214, 215 compared with the signal supplied by oscillator 202 causes the detection circuits 206 and 207 to emit a DC error signal corresponding to the detection achieved.

The error signal supplied by the detection circuit 206 is transmitted to an amplifier 208 which supplies at the input E21 of measurement cell 2 a DC current of a level corresponding to the error signal. A DC current flows in the compensation coil 24 between the input terminals E21 and E22. A continuous magnetic field is induced in wafer 30.

Similarly, the error signal supplied by the detection circuit 207 is transmitted to a DC supply circuit 209 which delivers a DC current to the measurement cell 3 and induces a continuous magnetic field in wafer 30.

A differential amplifier 212 is connected to the outputs of supply circuits 208 and 208. It delivers at its output to a measurement apparatus 213 a signal corresponding to the difference between the levels of the DC signals supplied to the compensation coils 24 and 34. The measurement apparatus 213 causes then the value to be displayed of the magnetic field gradient measured between the two positions where the measurement cells 2 and 3 are located. Measurement apparatus 210 and 211 are inserted in the circuits transmitting DC signals to the input terminals E21 and E31. With them, if so desired, the value of the magnetic fields at the positions of the measurement cells 2 and 3 may be measured.

Figure 6:
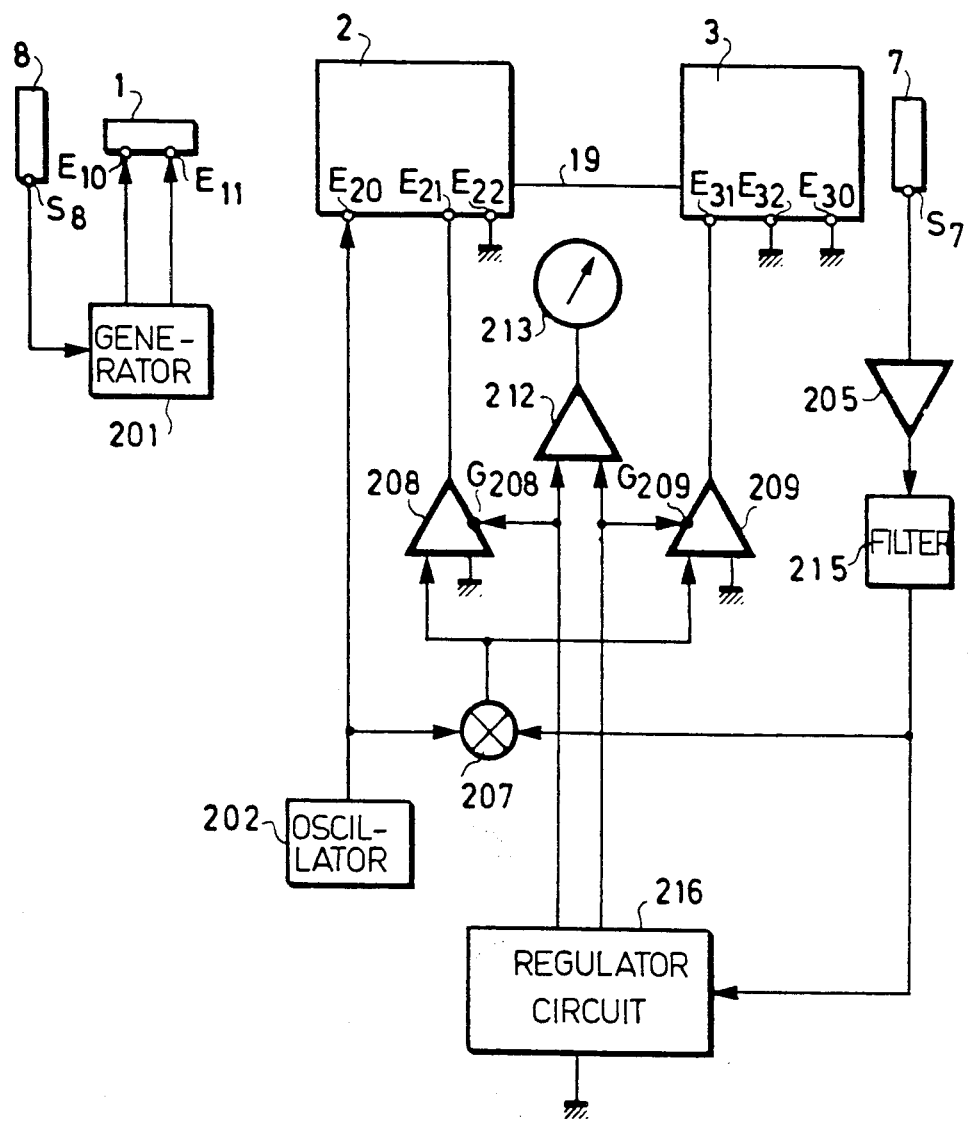
FIG. 6 shows a concrete example of the circuits for controlling the measurement head of FIGS. 2 and 3 and forming with the measurement head the measurement apparatus of the invention.

FIG. 6 is a diagram of circuits for operating the measurement head of the variants shown in FIGS. 2 and 3.

We find again in this figure the laser diode 1 and its supply circuit 201, the measurement cells 2 and 3 and the photodetector diodes 7 and 8.

The laser diode is supplied as before from the supply circuit 201. In addition, the photodetector diode receiving a light beam from the laser diode supplies a signal at its output S8 for regulating the power supplied by circuit 201.

Oscillator 202 supplies with AC current between terminals E20 and E30 the measurement cells 2 and 3.

The photodetector diode 7 supplies at its output S7 a signal which is amplified by amplifier 205, then filtered by a filter 215. As before, filter 215 supplies a signal which is compared with the signals supplied by oscillator 202 in the comparison circuit 207. The comparison circuit 207 delivers a continuous error signal which is amplified by two amplifiers 208 and 209 and is applied to the input terminals E21 and E31 of measurement cells 2 and 3 for supplying with power the compensation coils 24 and 34. These receive then the same current which corresponds to maximum compensation.

Since the magnetic fields are assumed different at the locations of the two measurement cells 2 and 3, it is now advisable to adjust separately the power supplies of the two compensation coils 23 and 34. For that, a regulation circuit 216 is actuated by means not shown. This actuation may be initiated manually or automatically by means of a time delay which leaves the time required for the preceding circuits to operate. The regulation circuit 216 is of the proportional-integral-derivative type such as used widely in temperature regulation systems for example. It receives the signal supplied by filter 215, compares it with a reference value to which a zero value is preferably given. Such a circuit may operate as desired in three different modes providing output signals either proportional to the result of the comparison or an integral function or a derivative function. It provides in response a control signal at one of the gain control inputs G208 or G209 of the differential amplifiers 208 and 209. One of the differential amplifiers 208 or 209 supplies a signal for completing the compensation.

A differential amplifier 212 is connected to the gain control inputs G208 and G209. It outputs to a measurement apparatus 213 a signal corresponding to the difference between the signals controlling the gain of amplifiers 208 and 209.

Measurement apparatus 213 permits then the value of the magnetic field gradient measured between two positions where measurement cells 2 and 3 are located to be displayed.

What is claimed is:

1. A measurement head for a magnetic field gradient vector measuring apparatus comprising an emission device for emitting respectively from opposite faces thereof a first and second linearly polarized light beam propagating along the same axis of propagation in opposite directions a first and second cell made from magnetic material spaced from said emission device on opposite sides thereof, each cell comprising an input face and an output face aligned along the axis of the light beam and allowing, therewithin, guided propagation of one of the beams as well as rotation of the polarization direction of the beam during its propagation as a function of the magnetic field at the cell; first and second means each associated with a respective cell for measuring the polarization rotation associated with each cell along the axis of the light beam, each of said means for measuring receiving the beam after it has passed through the associated cell; difference computing means receiving measurement signals from said first and second measuring means and supplying in exchange information representative of the difference between the two measurement signals indicating the gradient of the magnetic field between said two measurement points.

2. The measurement head as claimed in claim 1, wherein the emission device comprises a semiconductor laser the first cell and a first measurement means being situated in the path of the first beam, a second cell and a second measurement means being situated in the path of the second beam so that each cell receives a beam on its input face and transmits it through its output face to the measurement means which is associated therewith.

3. The measurement head according to claim 1 comprising, associated with each cell, a magnetic means inducing in each corresponding cell a continuous and adjustable compensating magnetic field directed along the axis of propagation of the light beam.

4. The measurement head as claimed in claim 3, comprising a first compensation coil for inducing an adjustable and continuous compensating magnetic field in the first cell and a second compensation coil for inducing another adjustable and continuous compensating magnetic field in the second cell.

5. The measurement head as claimed in claim 1, comprising magnetic means inducing in both cells a continuous magnetic field orientated in the plane of propagation of the beam transversely to the axis of propagation.

6. The measurement head as claimed in claim 1, comprising magnetic means inducing in both cells an alternating modulation magnetic field orientated along the axis of propagation of the light beam.

7. The measurement head as claimed in claim 6, wherein the magnetic means inducing an alternating modulation magnetic field are formed by a coil common to both cells and supplied with an AC current.

8. The measurement head as claimed in claim 1, wherein each measurement means comprises an analyzer crossed with respect to the direction of polarization of the light emitted by the emission means as well as a photodetector.

9. A process for measuring a magnetic field gradient between first and second measurement points in a medium having respectively a first local magnetic field and a second local magnetic field both of the same direction, comprising the following steps:
   (a) emitting a first polarized light beam along an axis in a first direction through the first measurement point, emitting a second polarized light beam along said axis in an opposite direction from the first direction through the second measurement point, each light beam having a polarization which varies as a function of the respective local magnetic field while passing through one of the two measurement points, and producing corresponding electrical detection signals in response to the detection of said first and second light beams after passing through each of said two measurement points;
   (b) producing a compensating magnetic field at each of the two measurement points, said compensating magnetic fields minimizing the effect of the first local magnetic field and of the second local magnetic field on the polarization of the light beams;
   (c) selectively varying in response to said detection signals the two compensating magnetic fields to cancel out the effect of the two local magnetic fields on the polarization of the light beams;

(d) measuring the amount of variation of each of the two compensating magnetic fields;

(e) taking the difference between the measurements of the variations of the two compensating magnetic fields to determine the gradient of the magnetic field between said two measurement points.

10. The measurement process as claimed in claim 9, wherein the selective variation of the two compensating magnetic fields is effected when a compensation balance of the two local magnetic fields by means of the same compensating magnetic field is achieved.

11. A measurement head for a magnetic field gradient vector measuring apparatus comprising an emission device for emitting respectively from two opposite faces thereof, a first and a second linearly polarized light beam propagating along the same axis of propagation in opposite directions; a first and a second cell made from magnetic material spaced from said emission device on opposite sides thereof, each cell comprising an input face and an output face aligned along the axis of the light beam and allowing, therewithin, guided propagation of one of the beams as well as rotation of the polarization direction of the beam during its propagation as a function of the magnetic field at the cell; first and second means each associated with a respective cell for measuring the polarization rotation associated with each cell along the axis of the light beam, each of said means for measuring receiving the beam after it has passed through the associated cell; difference computing means receiving measurement signals from said first and second measuring means and supplying in exchange information representative of the difference between the two measurement signals indicating the gradient of the magnetic means between said two measurement points; a magnetic means inducing in each corresponding cell a continuous and adjustable compensating magnetic field directed along the axis of propagation of the light beam, including a first compensation coil for inducing an adjustable and continuous compensating magnetic field in the first cell and a second compensation cell for inducing another adjustable and continuous compensating magnetic field in the second cell; an oscillator supplying an alternating signal to the first and second energization coils; a first supply circuit supplying a first DC current to the first compensation coil; a second supply circuit supplying a second DC current to the second compensation coil; a first comparison circuit comparing the result of the measurement effected by the first polarization rotation measurement means with the alternating signal supplied by the oscillator and delivering in response a control signal to the first supply circuit which then supplies a first DC current inducing a magnetic field counterbalancing the magnetic field existing in the first cell; a second comparison circuit comparing the result of the measurement effected by the second polarization rotation measurement means with the alternating signal supplied by the oscillator and delivering in response a control signal to the second supply circuit which then supplies a second DC current inducing a magnetic field counterbalancing the magnetic field existing in the second cell; a difference circuit calculating the difference between the first and second DC currents, and a display device displaying this difference.

12. A measurement head for a magnetic field gradient vector measuring apparatus comprising an emission device for emitting respectively from two opposite faces thereof first and second linearly polarized light beams propagating along the same axis of propagation in opposite directions, a first and second cell made from magnetic material spaced from said emission device on the same side thereof, each cell comprising an input face and an output face aligned along the axis of the first light beam and allowing, therewithin, guided propagation of the first beam as well as rotation of the polarization direction of the first beam during its propagation as a function of the magnetic field at the cell; a single means placed on the axis of the beam for measuring the polarization rotation associated with both cells along the axis of the light beam, said means for measuring receiving the first beam after it is passed through both cells; means for adjusting the power supplied to said emission device in response to said beam, said means for adjusting receiving the second beam; difference computing means receiving measurement signals from said measuring means and supplying in exchange information representative of the difference between the two measurement signals indicating the gradient of the magnetic field between said two measurement points.

13. The measurement head according to claim 12, wherein the first and second cells are disposed on the same side with respect to the emission device in series along a light beam emitted thereby.

14. The measurement head according to claim 12 comprising, associated with each cell, a magnetic means inducing in each corresponding cell a continuous and adjustable compensating magnetic field directed along the axis of propagation of the light beam.

15. The measurement head as claimed in claim 14, comprising a first compensation coil for inducing an adjustable and continuous compensating magnetic field in the first cell and a second compensation coil for inducing another adjustable and continuous compensating magnetic field in the second cell.

16. A measurement head for a magnetic field gradient vector measuring apparatus as claimed in claim 15, further comprising an oscillator supplying an alternating signal to the first and second energization coils; a first supply circuit supplying a first DC current to the first compensation coil; a second supply circuit supplying a second DC current to the second compensation coil; a comparison circuit connected to the measurement means for comparing the results of the measurement means with the alternating signals supplied by the oscillator and driving both the first and second supply circuits in the same way; a regulation circuit connected to the measurement means for receiving the measurement signal and supplying selectively to the first and second supply circuits level control signals; a differentiation circuit connected to the regulation circuit for receiving the level control signals and supplying a difference signal representing the difference between the level control signals; and a display device receiving the different signals and displaying the value thereof.

17. The measurement head as claimed in claim 12, comprising magnetic means inducing in both cells a continuous magnetic field orientated in the plane of propagation of the beam transversely to the axis of propagation.

18. The measurement head as claimed in claim 12, comprising magnetic means inducing in both cells an alternating modulation magnetic field orientated along the axis of propagation of the light beam.

19. The measurement head as claimed in claim 18, wherein the magnetic means inducing an alternating modulation magnetic field are formed by a coil common to both cells and supplied with an AC current.

20. The measurement head as claimed in claim 12, wherein the measurement means comprises an analyzer crossed with respect to the direction of polarization of the light emitted by the emission means as well as a photodetector.

21. The measurement head as claimed in claim 12, further including mirror means for reflecting said first light beam so that said first light beam passes through said first and second cells more than one time.

22. A process for measuring a magnetic field gradient between first and second measurement points in a medium having respectively a first local magnetic field and a second local magnetic field both of the same direction, comprising the following steps:

(a) emitting a first and second polarized light beam in opposite directions along an axis said first light beam having a polarization which varies as a function of said local magnetic fields while passing through the two measurement points and producing an electrical detection signal in response to the detection of said first light beam after passing through said two measurement points;

(b) producing a compensating magnetic field at each of the two measurement points, said compensating magnetic fields minimizing the effect of the first local magnetic field and of the second local magnetic field on the polarization of the first light beam;

(c) selectively varying in response to said detection signal the two compensating magnetic fields to cancel out the effect of the two local magnetic fields on the polarization of the first light beam;

(d) taking the difference between the two compensating magnetic fields to determine the gradient of the magnetic field between said two measurement points;

(e) adjusting the power for emission of said light beams in response to the detection of the second light beam.

* * * * *